(12) United States Patent
Yi et al.

(10) Patent No.: US 8,525,553 B1
(45) Date of Patent: Sep. 3, 2013

(54) NEGATIVE DIFFERENTIAL RESISTANCE COMPARATOR CIRCUITS

(75) Inventors: Wei Yi, Mountain View, CA (US); Jianhua Yang, Palo Alto, CA (US); Matthew D. Pickett, San Francisco, CA (US); Minxian Max Zhang, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/459,877

(22) Filed: Apr. 30, 2012

(51) Int. Cl.
*H03K 19/02* (2006.01)

(52) U.S. Cl.
USPC .......................... 326/135; 326/132; 326/134

(58) Field of Classification Search
USPC .......................... 326/132, 134, 135
See application file for complete search history.

(56) References Cited

U.S. PATENT DOCUMENTS

| | | | |
|---|---|---|---|
| 5,023,836 A | 6/1991 | Mori | |
| 5,313,117 A | 5/1994 | Maezawa | |
| 6,323,709 B1 | 11/2001 | Kulkarni et al. | |
| 7,015,724 B2 * | 3/2006 | Godin | 326/134 |
| 7,372,306 B1 | 5/2008 | Khitun et al. | |
| 7,403,032 B2 * | 7/2008 | Yang et al. | 326/6 |
| 7,573,310 B2 | 8/2009 | Yang et al. | |

FOREIGN PATENT DOCUMENTS

JP 59211283 A 11/1984

* cited by examiner

*Primary Examiner* — Anh Tran

(57) ABSTRACT

In one example, an oxide-based negative differential resistance comparator circuit includes a composite NDR device that includes a first electrode, a first thin film oxide-based negative differential resistance (NDR) layer in contact with the first electrode and a central conductive portion. The composite NDR device also includes a second thin film oxide-based NDR layer disposed adjacent to the first NDR layer and a second electrode. A resistor may be placed in series with the composite NDR device and an electrical energy source can apply applying a voltage across the first electrode and second electrode. The composite NDR device produces a threshold based comparator functionality in the comparator circuit.

15 Claims, 12 Drawing Sheets

Fig. 4A  Fig. 4B

NEGATIVE DIFFERENTIAL RESISTANCE COMPARATOR CIRCUITS

STATEMENT OF GOVERNMENT INTEREST

This invention was made with government support awarded by Defense Advanced Projects Research Agency (DARPA). The government has certain rights in the invention.

BACKGROUND

Negative Differential Resistance (NDR) is a property displayed by some devices where an increase in current across the device results in a decreased voltage across the device in some operational regimes. Similarly, an increase in voltage across an NDR device may result in a decreased amount of current. NDR devices have the potential to be used in a wide variety of circuits and computing devices, particularly where ultrafast switching speed is a significant design consideration.

BRIEF DESCRIPTION OF THE DRAWINGS

The accompanying drawings illustrate various examples of the principles described herein and are a part of the specification. The illustrated examples are merely examples and do not limit the scope of the claims.

FIG. 4A is a circuit diagram of a circuit that includes negative differential resistance devices, according to one example of principles described herein.

FIG. 4B is a cross sectional diagram of a composite device that includes negative differential resistance devices, according to one example of principles described herein.

Throughout the drawings, identical reference numbers designate similar, but not necessarily identical, elements.

DETAILED DESCRIPTION

Negative differential resistance (NDR) is "locally active" in the region where the differential resistance of the device is negative. In this region, the device exhibits a step-function like discontinuity in its behavior. There are two different types of NDR: so-called 'N-' (named because of the shape of the current/voltage curve) or Voltage-Controlled NDR (VC-NDR); and 'S-' or Current-Controlled-NDR (CC-NDR). For CC-NDR, an increase in current across the device results in a decreased voltage across the device in some operational regimes. For VC-NDR, an increase in voltage across the device results in a decreased amount of current in some operational regimes.

This specification describes a number of oxide-based negative differential resistance comparator circuits that can be used to implement comparator functionality. In general, this is accomplished forming two oxide-based NDR devices in series or parallel in a composite NDR device. The negative differential resistance region and hysteresis in the I-V behavior of the oxide-based NDR devices can be designed to produce the desired step-like transfer functions of a comparator. A number of illustrative circuits are discussed that use both voltage controlled and current controlled NDR devices.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1A:
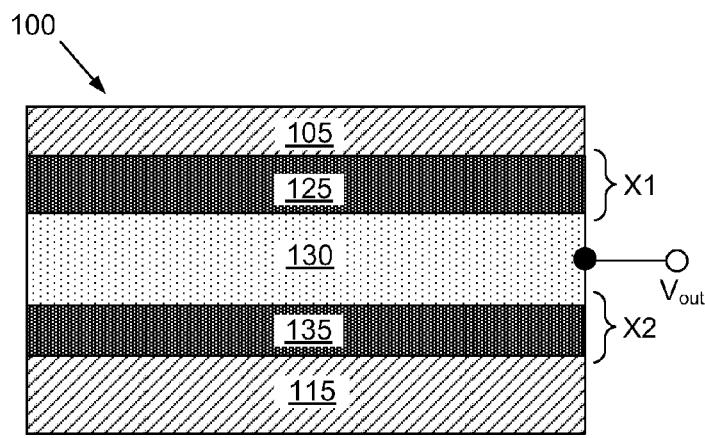
FIGS. 1A-1C show examples of composite devices that include oxide-based negative differential resistance layers, according to one example of principles described herein.
Figure 1A:
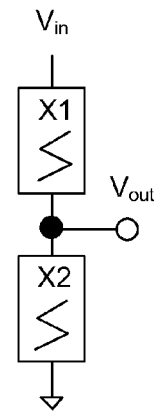

FIG. 1A includes a cross sectional diagram of an illustrative composite electrical device that includes two NDR devices, X1 and X2. The composite device includes top and bottom electrodes (105, 115), a first NDR oxide layer (125), a second NDR oxide layer (135) and a central portion (130). The first NDR oxide layer (125) interfaces with the top electrode (105) and central layer (130) to form the first NDR device X1; the second NDR oxide layer (135) and its interfaces with the lower electrode (115) and central layer (130) form the second NDR device X2.

The circuit diagram on the right of FIG. 1A shows an electrical schematic of the composite device (100). The two NDR devices (X1, X2) are in series. The input voltage ($V_{in}$) is applied to one electrode (105) and the opposing electrode (115) is grounded. The output voltage ($V_{out}$) is measured at the center oxide layer (130). The central layer (130) may be formed from a conductive material, metal oxides (including metal oxides that act as a memristive matrix), doped semiconductors or other materials.

The electrodes (105, 115) can be formed from any of a number of different conductive materials, including metals, doped semiconductors, conductive polymers, and other appropriate materials. The NDR oxide layers may be formed from any of a variety of oxides or nitrides that exhibit either voltage or current controlled NDR behavior. For example, current controlled NDR oxide layers (125, 135) may be made from a variety of materials that exhibit a current controlled insulator to conductor phase transformation beyond certain threshold temperatures. These materials include, but are not limited to, metal oxides and nitrides. For example, these materials may include vanadium dioxide ($VO_2$), niobium dioxide ($NbO_2$), titanium oxides ($Ti_4O_7$, $Ti_2O_3$, etc.), nickel monoxide (NiO), molybdenum oxides, tungsten oxides, manganese oxides, nobiates, alloys thereof and other appropriate materials. Voltage controlled NDR oxide layers may be formed from a variety of materials including chromium doped vanadium trioxide ($V_2O_3$), zirconium tungsten oxide, conductive materials with negative thermal expansion, and other appropriate materials or structures. Additional information regarding negative differential resistance devices can be found in the paper "*Coexistence of Memristance and Negative Differential Resistance in a Nanoscale Metal-Oxide-Metal System*", Matthew D. Pickett, Julien Borghetti, J. Joshua Yang, Gilberto Medeiros-Ribeiro, and R. Stanley Williams, Adv. Mater. 23, 1730 (2011).

Figure 1B:
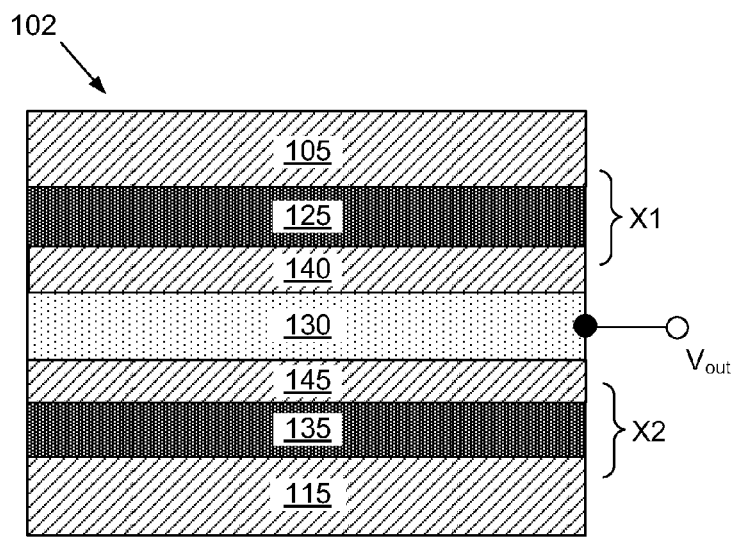
Figure 1B:
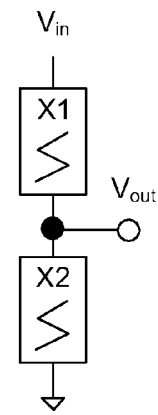

FIG. 1B includes a cross sectional diagram of an illustrative composite device (102) that also includes two NDR devices, X1 and X2, and top and bottom electrodes (105, 115). However, in this case, the central portion includes additional conductive layers (140, 145) that are sandwiched between the NDR oxide layers (125, 135) and the central oxide layer (130). These additional conductive layers (140, 145) can serve a number of purposes, including acting as a barrier to prevent molecular migration between the different oxide layers and ensuring that the uniform electrical contact is made between the NDR oxide layers (125, 135) and the central layer (130). The circuit diagram on the right of the FIG. 1B shows that an input voltage ($V_{in}$) is applied across the electrodes (105, 115) and output voltage ($V_{out}$) is measured at the center oxide layer (130).

Figure 1C:
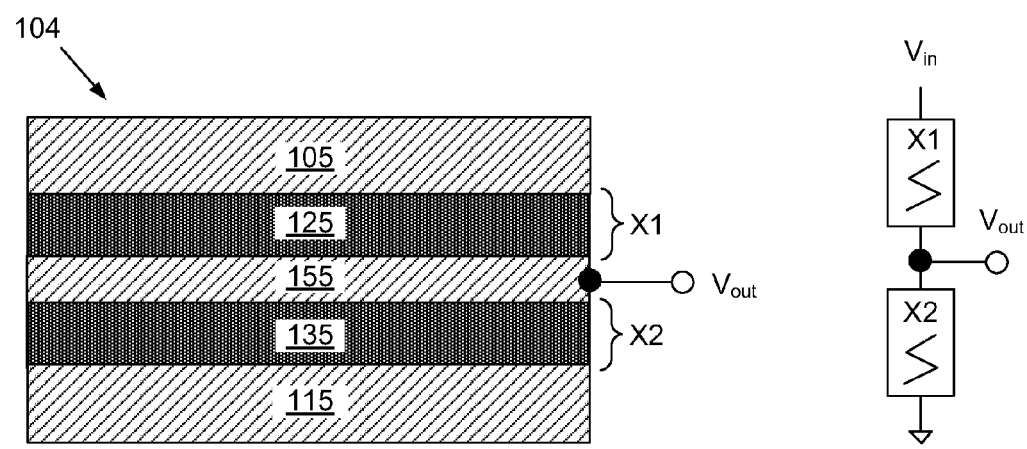

FIG. 1C is a cross sectional diagram of an illustrative composite device (104) that also includes two NDR devices, X1 and X2, and top and bottom electrodes (105, 115). A center layer (155) is sandwiched between the two NDR oxide layers (125, 135). In this implementation, the center layer (155) is formed from a conductive metal. The circuit diagram on the right of FIG. 1C shows that an input voltage ($V_{in}$) is applied across the electrodes and an output voltage ($V_{out}$) is measured at the center oxide layer (155).

Layers in the devices shown above may be deposited in a number of ways. In some examples, the layer may be deposited using the same techniques. In other examples, some of the layers may be deposited using one technique and other layers in the same device may be deposited with another technique. The layers may be deposited using chemical vapor deposition, sputtering, reactive sputtering, plating, physical vapor deposition, spin coating, atomic layer deposition, pulsed laser deposition, printing, or any other suitable deposition technique. For example, the conductive layers may be deposited using plating and the oxide layers may be deposited using sputtering. For example, the various layers may be formed using thin film deposition techniques. In general, the term "thin film" refers to layers of material ranging from fractions of a nanometer (monolayer) to layers that are several micrometers in thickness.

Figure 2A:
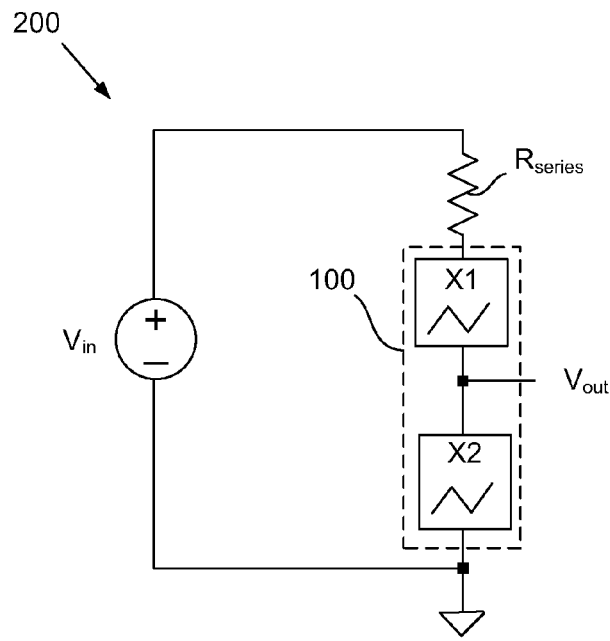
FIG. 2A is a circuit diagram of a comparator circuit that includes voltage controlled negative differential resistance devices, according to one example of principles described herein.

FIG. 2A is a circuit diagram that shows a composite device that includes two voltage controlled NDR devices (X1, X2) in series. A resistor $R_{series}$ is in series with the composite device (100). In some implementations, the resistor $R_{series}$ may be formed as part of the composite device. For example, the resistor $R_{series}$ could be implemented as a resistive thin film deposed over one of the electrodes (105, 115). A voltage $V_{in}$ is applied across the resistor and two NDR devices (X1, X2). The output voltage ($V_{out}$) is taken from an intermediate layer within the combined device.

Figure 2B:
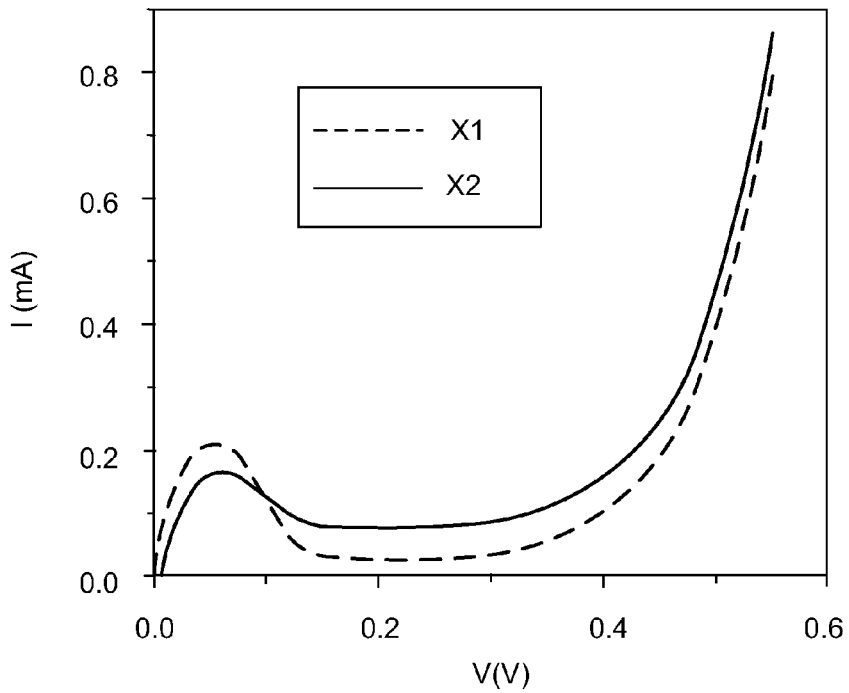
FIG. 2B shows the individual current-voltage characteristics of each negative differential resistance device in the circuit of FIG. 2A, according to one example of principles described herein.

FIG. 2B shows graphs of current-voltage behavior of the NDR devices (X1, X2). The horizontal axis shows applied voltage in volts and the vertical axis shows the current passing through an NDR device. The current-voltage behavior of the first NDR device (X1) is shown as a dashed line. At low voltages (between 0 volts and approximately 0.05 volts), increasing voltage results in increased current through the NDR devices. At moderate voltages (between 0.05 volts and 0.2 volts), an increase in voltage results in decreased current. This is the negative differential resistance region for this particular voltage controlled NDR device. In this example, increasing the voltage across the NDR device above 0.2 volts results in increasing current through the device. The solid line represents the current-voltage behavior of the second voltage controlled NDR device (X2). The behavior of the second NDR device (X2) has a similar behavior as the first NDR device (X1) and has similar threshold voltages, but a different current magnitude for an applied voltage.

Figure 3A:
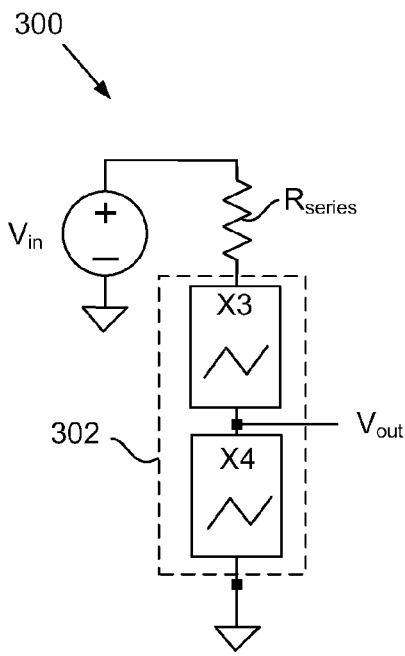
FIG. 3A is a circuit diagram of a comparator circuit that includes current controlled negative differential resistance devices, according to one example of principles described herein.

FIG. 3A is a circuit diagram of a circuit (300) that includes current controlled NDR devices (X3, X4). The circuit diagram shows a composite device (302) that includes the two current controlled NDR devices (X3, X4) in series. A resistor $R_{series}$ is in series with the composite device. An input voltage ($V_{in}$) is applied across the resistor and the two NDR devices (X3, X4). The output voltage ($V_{out}$) is taken from an intermediate layer within the combined device.

Figure 3B:
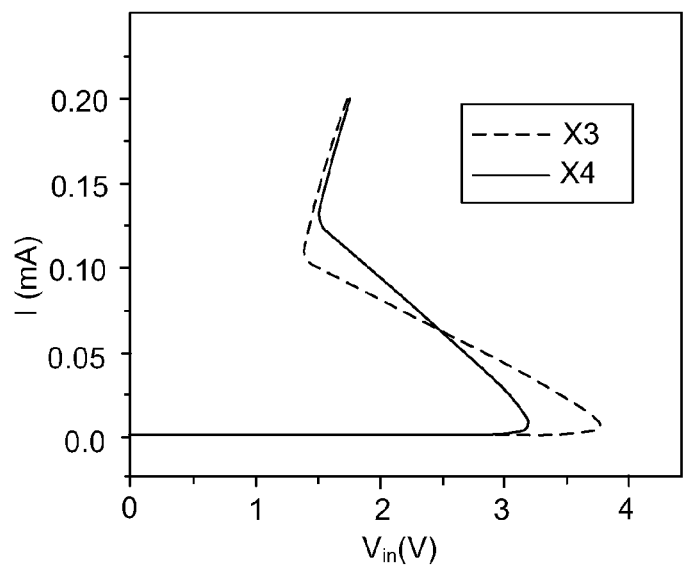
FIG. 3B shows the current-voltage characteristics of the negative differential resistance devices in the circuit of FIG. 3A, according to one example of principles described herein.

FIG. 3B is a graph that shows the individual current-voltage curves for the current controlled NDR devices X3 and X4. The curves exhibit the "S" shape that is a characteristic of current controlled NDR device. The performance of the first NDR device (X3) is shown as a dashed line. When voltage is initially applied to the current controlled NDR device, very little current flows through the device. This is shown as a flat line at 0.0 mA that extends form 0 volts to about 3.75 volts for device X3. At a transition threshold, the current begins to flow through the NDR device and continues to increase even as the voltage across the device is decreased. This is the negative differential resistance of the device. At a second transition point (for device X3 at approximately 1.5 volts and 0.1 mA) the device transitions out of the negative differential resistance region and exhibits increasing current flow for increasing voltages. The device remains in the low-resistance state at current levels higher than the threshold value of 0.1 mA. The performance of NDR device X4 is shown as solid line that has slightly different magnitudes but exhibits similar shape and behavior. The numeric values shown in this and other graphs are merely illustrative of the general behavior of the devices and circuits and are not intended to be qualitative examples. The structure and characteristics of the NDR devices and circuits can be altered to achieve the design parameters of a given task.

FIG. 4A is a circuit diagram of a circuit (400) that contains two current controlled NDR devices (X1, X2) in series. The NDR devices are also in series with a resistance (Rseries). In this example, the series resistance (Rseries) has a resistance of 100Ω. The input voltage ($V_{in}$) or current is placed across these series components (X1, X2, Rseries). As discussed above, the two NDR devices and series resistance can be constructed as a single composite device. The output voltage is extracted from between the two NDR devices (X1, X2). A load resistance ($R_{load}$) is placed in parallel with the second NDR device (X2).

FIG. 4B is a cross section of a combined device (402) that incorporates the series resistor (Rseries) and NDR devices (X1, X2) into a single layered stack. In this example, the combined device (402) includes four conductive layers (405, 415, 425, and 435). The series resistor is a layer of resistive material (410) formed between the first two conductive layers (405, 415). In some cases, the resistivity of the conductive layers (405 and 415) can be adjusted so that there is no need to include a separate resistive material (410). The first NDR device is formed from a NDR layer (420) between the second and third conductive layers (415, 425) and the second NDR device is formed from another NDR layer (430) formed between the third and fourth conductive layers (425, 435). A voltage applied between the first conductive layer (405) and the fourth conductive layer (435) passes through the resistive layer (410) and NDR layers (420, 430) in series. The output voltage ($V_{out}$) is extracted from the device at the third conductive layer (425).

Figure 4C:
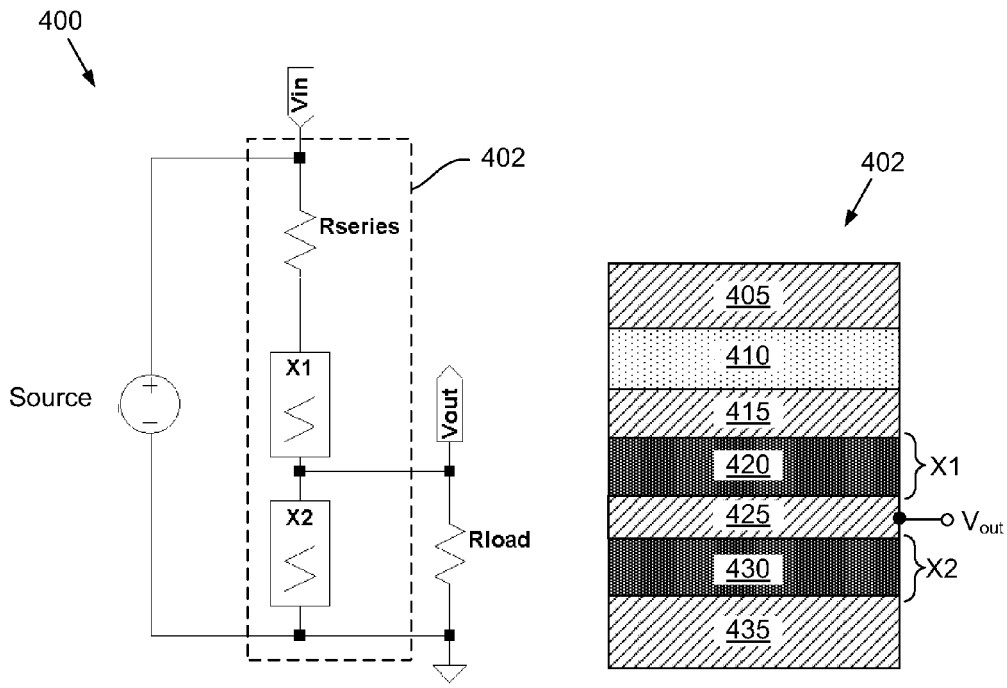
FIG. 4C is a graph of a transfer function of the circuit shown in FIG. 4A, according to one example of principles described herein.
Figure 4C:
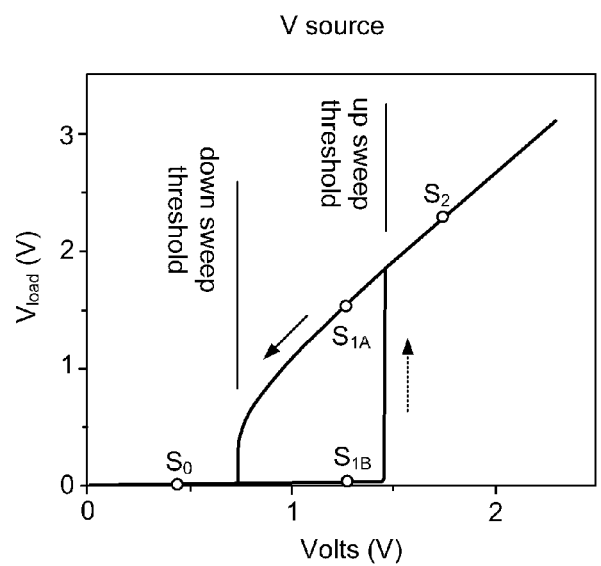

FIG. 4C shows a transfer function of the circuits shown in FIGS. 3A and 4A that both have two CC-NDR devices in series. To make the graph, the input voltage was swept from 0 volts up to 2.5 volts (the "up-sweep") and then swept from 2.5 volts back to 0 volts (the "down-sweep"). As the voltage increases during the up-sweep, the output voltage $V_{out}$ through the device remains minimal until the voltage ($V_{in}$) reaches an up-sweep threshold between 1.4 and 1.5 volts. The output voltage $V_{out}$ through the device then abruptly increases to approximately 1.7 volts and then continues to increase as a function of increasing voltage to a maximum of 2.5 volts at an input voltage of approximately 2.3 volts.

On the down-sweep, the voltage is swept from 2.5 volts back to 0 volts. Initially, the output voltage through the device decreases as an approximately linear function of the applied voltage $V_{in}$. However, as the $V_{in}$ voltage level approaches a down-sweep threshold at approximately 0.75 volts, the output voltage $V_{out}$ abruptly drops to zero. These measurements demonstrate that the circuits in FIGS. 3A and 4A can function as a Schmitt trigger with its output voltage a step-like function of the input voltage. It also shows hysteretic behavior typically seen in traditional comparator circuits. The points $S_0$ and $S_2$ on the graph refer to operating points described in FIGS. 6A-6D. Points $S_{1A}$ and $S_{1B}$ define operating points that are in different states at the same voltage in the bistable region.

Figure 5:
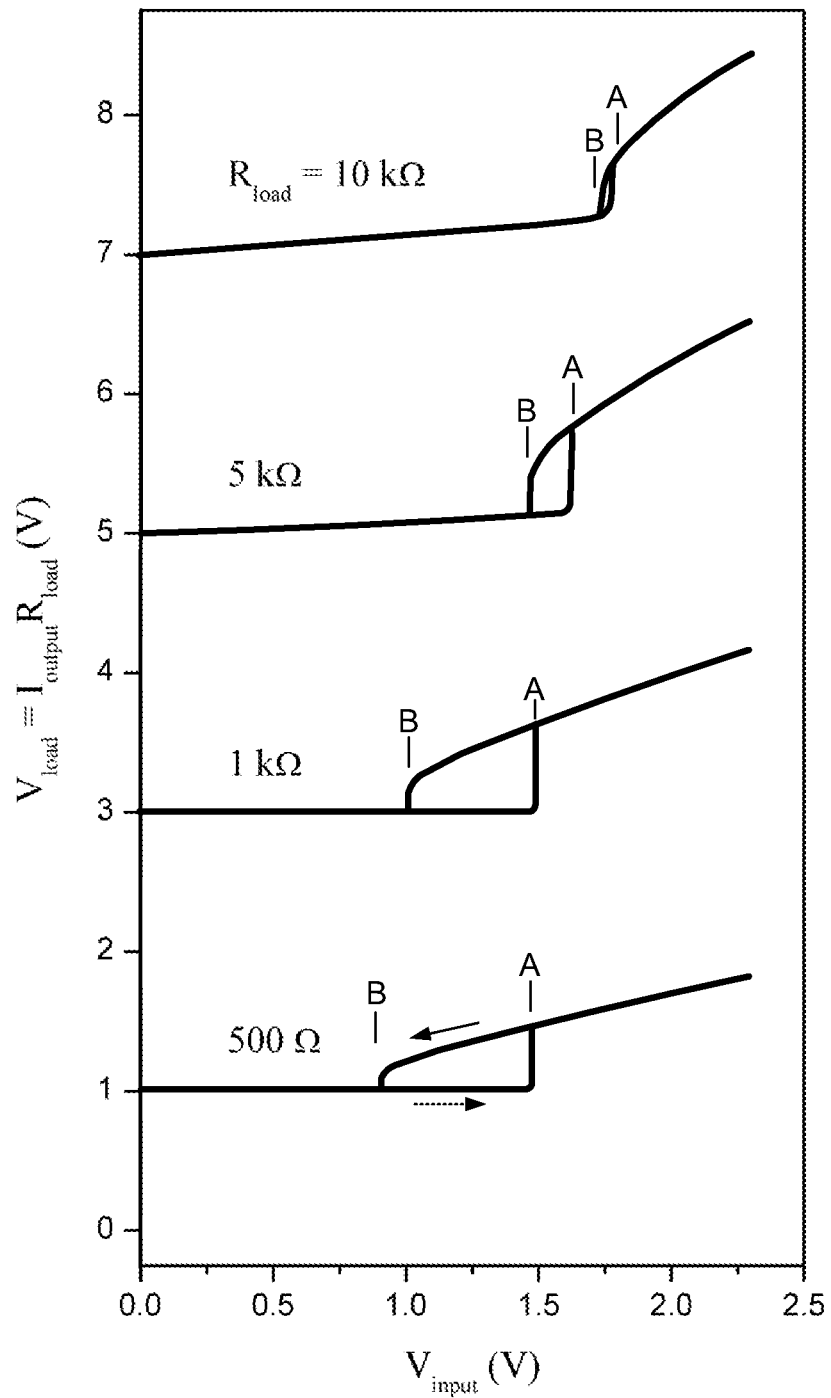
FIG. 5 is shows changes in a transfer function of the circuit shown in FIG. 4A as a function of varying load resistances, according to one example of principles described herein.

FIG. 5 shows a series of curves that describe changes in the current/voltage behavior of the circuit (400) as a function of increasing $R_{load}$ resistances. These curves are similar to the curve shown in FIG. 4C and include up-sweep and down-sweep thresholds. FIG. 5 shows the hysteresis loop width and the particular value of the threshold voltages are dependent on $R_{load}$. Each of the curves has been artificially offset by two volts to separate the curves for a clearer graphical representation of the circuit behavior. For a load resistance ($R_{load}$) of 500Ω, the beginning portion of the curve is relatively flat to the upsweep threshold level (labeled "A") of about 1.5 volts. At the up-sweep threshold, the $V_{load}$ increases suddenly and then increases as a function of increasing voltages. During the downward sweep, the load voltage $V_{load}$ decreases as a function of decreasing input voltages $V_{input}$, until reaching a downward threshold (labeled "B") at approximately 0.75 volts. After this point in the downward sweep of $V_{input}$, the curve is flat and the load voltage remains at substantially zero. The area enclosed by the upward sweep curve and the downward sweep curve is the hysteresis loop.

Increasing the load resistance $R_{load}$ between 500Ω and 1 kΩ results in the hysteresis loop becoming taller, and the downward sweep threshold increasing slightly from approximately 0.75 volts to 1 volt. However, the flat initial portion and the upward sweep threshold at approximately 1.5 volts remain approximately the same. Increasing the load resistance from 1 kΩ to 10 kΩ results in a number of changes. The down-sweep threshold B continues to increase as the load resistance increases. For example, the down-sweep threshold B is at approximately 1 volt for a load resistance of 1 kΩ and is approximately 1.7 volts for a load resistance of 10 kΩ. The up-sweep threshold "A" begins to increase but does not increase as rapidly as the down-sweep threshold. For example, the up-sweep threshold "A" is at approximately 1.5 volts for a load resistance of 1 kΩ and is approximately 1.8 volts for a load resistance of 10 kΩ. The changes in the thresholds results in compression of the hysteresis loop as the load resistance increases. The curve for a load resistance of $R_{load}$=10 kΩ shows that the hysteresis loop is compressed so that the downward sweep threshold and the upward sweep threshold are almost the same. As shown in FIG. 5, $R_{load}$ is used to control hysteresis effects for particular applications. A buffer amplifier can be added to Vout to control the $R_{load}$ value.

Figure 6A:
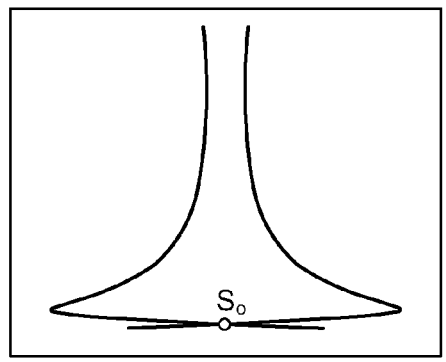
FIGS. 6A-6D show various load line graphs for the circuit shown in FIG. 4A, according to one example of principles described herein.

To better understand the transfer function behavior of the circuit in FIG. 4A, FIGS. 6A-6D show graphs of load lines for the circuit with two NDR devices in series. In FIG. 6A, the load line for a first NDR device is shown on the left and the load line for the second NDR device is shown on the right. In this example, the NDR devices are identical and the load lines are identical mirror images of each other. However, in some implementations the NDR devices may not be identical due to design or manufacturing variation. In FIG. 6A, the applied input voltage is low and separation between the two curves is relatively large. The intersection $S_o$ between the two load lines represents a potential operating point for the circuit. This operating point $S_o$ is a stable operating point because when the circuit is subject to perturbations, the circuit will tend to return to the operating point $S_o$. Both NDR devices are in their high-resistance states and the $V_{out}$ of comparator is low.

Figure 6B:
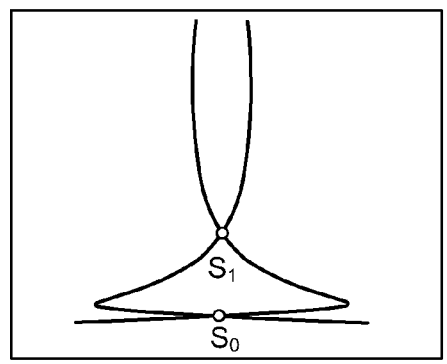
Figure 6C:
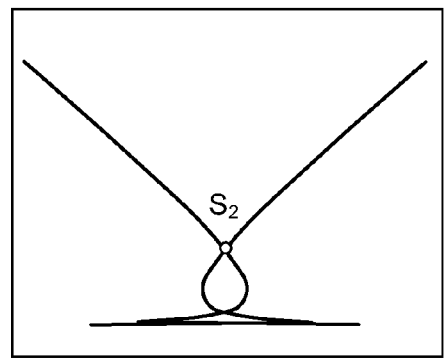
Figure 6D:
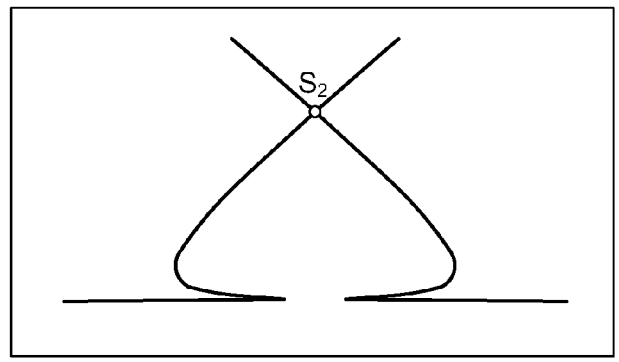

As the applied input voltages increase, the load lines come closer together to form additional operating points. FIG. 6B shows the load lines coming together to form an additional operating point $S_1$. The operating point $S_1$ is an unstable operating point because perturbations to the circuit will tend to cause the circuit behavior to leave operating point $S_1$. FIG. 6C shows load lines that have come together an additional distance to form a third operating point $S_2$. This operating point is also unstable. In FIG. 6D, the load lines have moved past each other to the left and the right such that only the operating point ($S_2$) remains.

FIGS. 7A-7E shows the operation of the circuit shown in FIG. 4A over a range of $R_{load}$ values. The difference between FIG. 5 and FIGS. 7A-7E is that the graphs in FIGS. 7A-7E show the operation of the circuit over a wider range of voltages to reveal a $2^{nd}$ hysteresis loop. Each of the graphs in FIGS. 7A-7E show the input voltage on the horizontal axis and the output voltage along the vertical axis. The input voltage ($V_{input}$) ranges from zero volts to approximately 4 volts. The output voltage is a function of the current passing through the load resistor ($R_{load}$) and the resistance of the load resistor ($R_{load}$). This relationship is described by Ohm's law that states that the voltage across a resistor is proportional to the product of the current passing through the resistor and the resistance of the resistor. To make the graphs, the input voltage was swept from 0 volts up to 4 volts (the "up-sweep") and then swept from 4 volts back to 0 volts (the "down-sweep"). The circuit behavior is different on the up-sweep than on the down-sweep. These differences form hysteresis loops. The up-sweep curve is identified by dashed arrows along the curve and the down-sweep is identified by solid arrows.

Figure 7A:
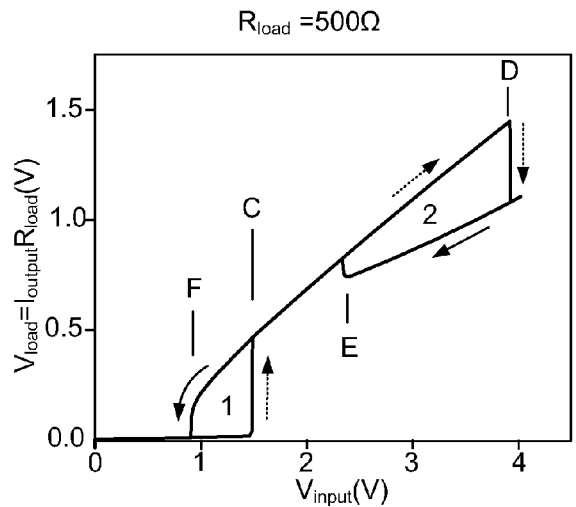
FIGS. 7A-7E show transfer functions of the circuit shown in FIG. 4A as a function of varying load resistances over a wider sweep of input voltage, according to one example of principles described herein.
Figure 7B:
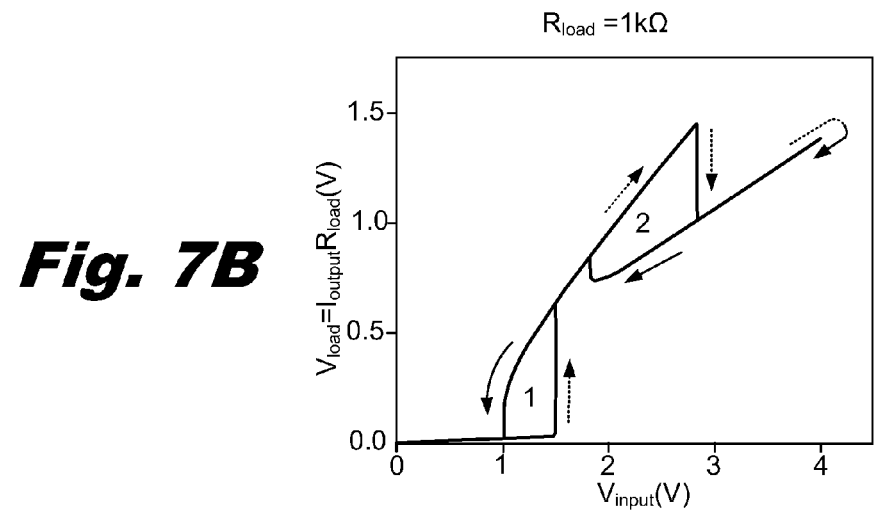

In FIG. 7A, the $R_{load}$ value is 500Ω. Initially, increases in the input voltage $V_{input}$ do not result in significant output voltages. At a first threshold on the up-sweep $V_{on\text{-}threshold}$ (upsweep) of approximately 1.48 volts, the output voltage suddenly jumps and then continues to increase as function of increasing input voltage. $V_{on\text{-}threshold}$ (upsweep) is indicated on the graph by the label "C". This proportional increase of the output voltage continues during the voltage up-sweep until the $V_{off\text{-}threshold}$ (up-sweep) at approximately 3.92 volts, where the output voltage suddenly drops. $V_{off\text{-}threshold}$ (up-sweep) is indicated on the graph by the label "D". On the down-sweep, the output voltage decreases until a $V_{on\text{-}threshold}$ (down-sweep) at approximately 2.34 volts. $V_{on\text{-}threshold}$ (down-sweep) is indicated on the graph by the label "E". This forms an upper hysteresis loop 2. Below the $V_{on\text{-}threshold}$ (down-sweep) the output voltage decreases as function of decreasing input voltage until a $V_{off\text{-}threshold}$ (down-sweep) at approximately 0.9 volts. $V_{off\text{-}threshold}$ (down-sweep) is indicated on the graph by the label "F". This forms a lower hysteresis loop 1. The output voltage is approximately zero during the remainder of the down-sweep to zero volts. Thus the unique electrical behavior of the circuit includes two hysteresis loops. These hysteresis loops can be used when dependence of the circuit state on past conditions is desirable or when a system with multiple states provides desired functionality. For example, Schmitt trigger implementations can be used to prevent unwanted rapid switching. This can be used to compensate for contact bounce in switches or noise in an electrical signal.

Figure 7C:
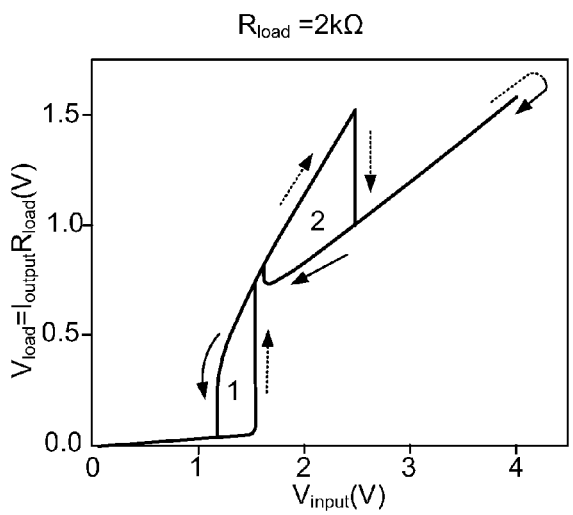

Increasing the resistance of $R_{load}$ changes the electrical behavior of the circuit and the size and shape of the two hysteresis loops. As shown above, these hysteresis loops can be described using various thresholds. For example, in FIG. 7B, the electrical resistance of $R_{load}$ is 1 kΩ and the thresholds are: $V_{on\text{-}threshold}$ (up-sweep)=1.5 V; $V_{off\text{-}threshold}$ (up-sweep)=2.84 V; $V_{on\text{-}threshold}$ (down-sweep)=1.82 V; and $V_{off\text{-}threshold}$ (down-sweep)=1.0 V. In FIG. 7C, the electrical resistance of $R_{load}$ is 2 kΩ and the thresholds are: $V_{on\text{-}threshold}$ (up-sweep)=1.54 V; $V_{off\text{-}threshold}$ (up-sweep)=2.48 V; $V_{on\text{-}threshold}$ (down-sweep)=1.61 V; and $V_{off\text{-}threshold}$ (down-sweep)=1.17 V.

Figure 7D:
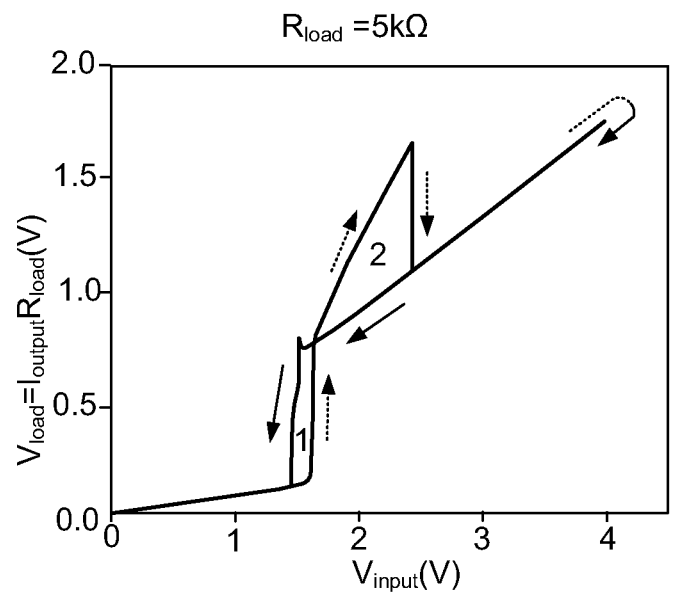
Figure 7E:
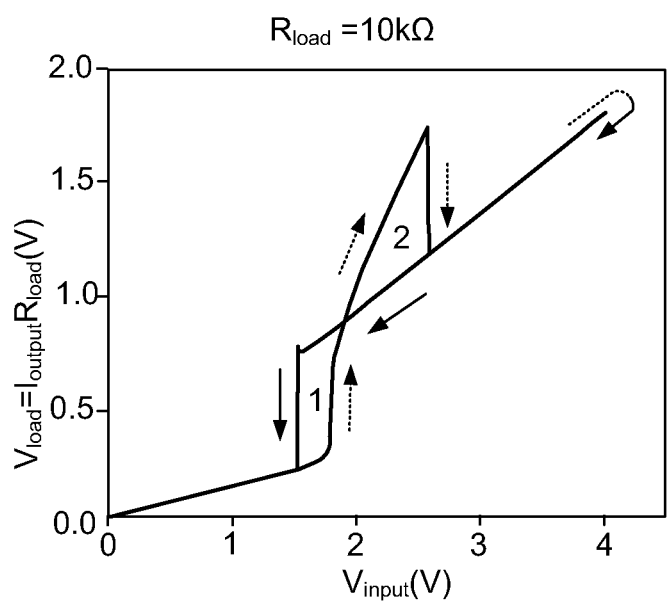

In FIG. 7D, the electrical resistance of $R_{load}$ is 5 kΩ and the thresholds are: $V_{on\text{-}threshold}$ (up-sweep)=1.63 V; $V_{off\text{-}threshold}$ (up-sweep)=2.44 V; $V_{on\text{-}threshold}$ (down-sweep)=1.53 V; and $V_{off\text{-}threshold}$ (down-sweep)=1.525 V. In FIG. 7E, the electrical resistance of $R_{load}$ is 10 kit and the thresholds are: $V_{on\text{-}threshold}$ (up-sweep)=1.79 V; $V_{off\text{-}threshold}$ (up-sweep)=2.57 V; $V_{on\text{-}threshold}$ (down-sweep)=1.52 V; and $V_{off\text{-}threshold}$ (down-sweep)=1.61 V. This information is summarized in Table 1 below.

TABLE 1

| | Voltage Thresholds | | | |
|---|---|---|---|---|
| Resistance of Rload | Von-threshold (upsweep) | Voff-threshold (upsweep) | Von-threshold (down sweep) | Voff-threshold (down sweep) |
| 500 | 1.48 | 3.92 | 2.34 | 0.9 |
| 1000 | 1.5 | 2.84 | 1.82 | 1 |
| 2000 | 1.54 | 2.48 | 1.61 | 1.17 |
| 5000 | 1.63 | 2.44 | 1.53 | 1.525 |
| 10000 | 1.79 | 2.75 | 1.52 | 1.51 |

Figure 8A:
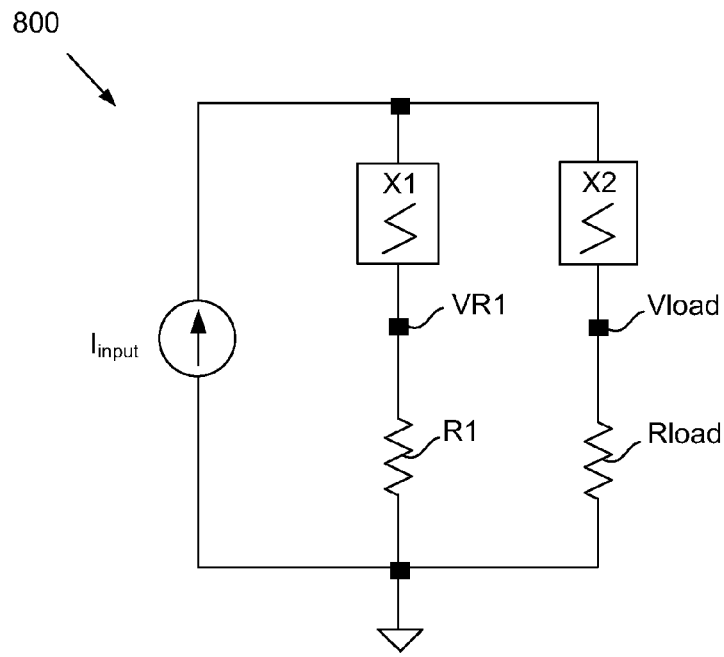
FIG. 8A is a circuit diagram of a current comparator circuit that includes negative differential resistance devices, according to one example of principles described herein.

In many applications, the output of a sensor (such as a photodiode) is in form of current instead of voltage. A comparator circuit that works in current mode instead of voltage mode is described in FIGS. 8A and 8B. The current comparator circuit (800) shown in FIG. 8A contains two current controlled NDR devices (X1, X2) in parallel. The current controlled NDR devices exhibit current/voltage behavior similar to that shown in FIG. 3B. In a first branch of the circuit (800), a first current controlled NDR device X1 is in series with a resistor R1. In a second branch of the circuit, a second current controlled NDR device is in series with a resistor Rload. Voltages (VR1 and Vload) may be measured between the NDR devices (VR1, Vload) and their respective series resistances (R1, Rload). An input current source $I_{input}$ generates a current that is divided between the two parallel branches of the circuit. In general, the current that flows through the branches is inversely proportional to the resistance of the branches. Thus, when the first branch has a resistance that is lower than the second branch, more current flows through the first branch.

Figure 8B:
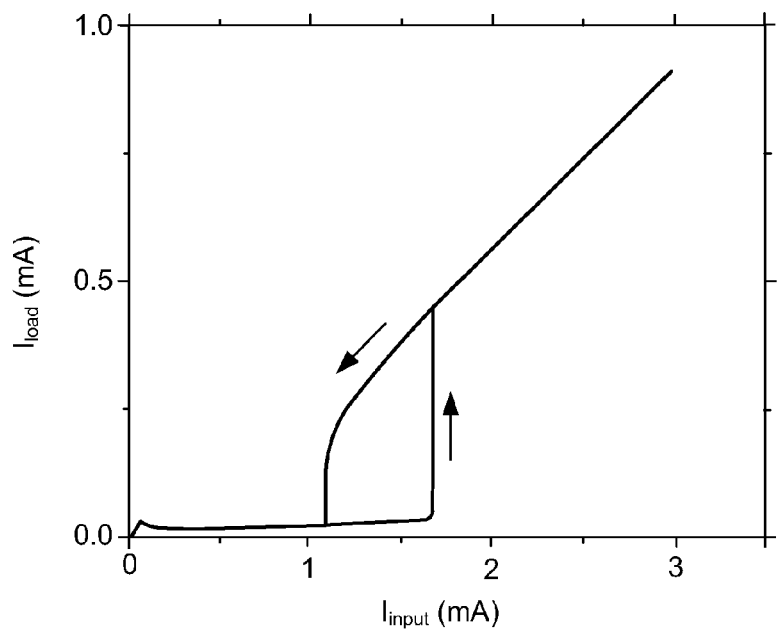
FIG. 8B is a graph of a transfer function of the circuit of FIG. 8A, according to one example of principles described herein.

FIG. 8B shows the current transfer function characteristics of the circuit as a current based Schmitt trigger or current comparator with hysteresis. To create the chart of FIG. 8B, the input current $I_{input}$ is swept from zero milliamps to three milliamps (upsweep) and then swept back down from three milliamps to zero milliamps (downsweep). As the input current $I_{input}$ initially increases, there is little output current $I_{load}$ through load resistance (Rload). This is shown by the flat horizontal portion of the curve that extends from 0 milliamps to approximately 1.7 milliamps. When the input current exceeds 1.7 milliamps, the current $I_{load}$ through the load resistance $R_{load}$ suddenly increases as shown by the sharply rising curve near 1.7 milliamps. Above 1.7 milliamps, the output current continues to rise as the input current increases. When the input current is swept back down from three milliamps, the transition to a low current through the resistance $R_{load}$ occurs at a down-sweep threshold (at approximately 1.1 milliamps).

Current comparators can be used in a variety of situations, including analog to digital converters and nonlinear current mode signal processing. In some implementations, the NDR devices may exhibit switching speeds on the order of nanoseconds. In contrast, silicone base thyristors exhibit switching speeds on the order of microseconds. Consequently, to measure current pulses shorter than microseconds, NDR devices may be the only option.

Figure 9:
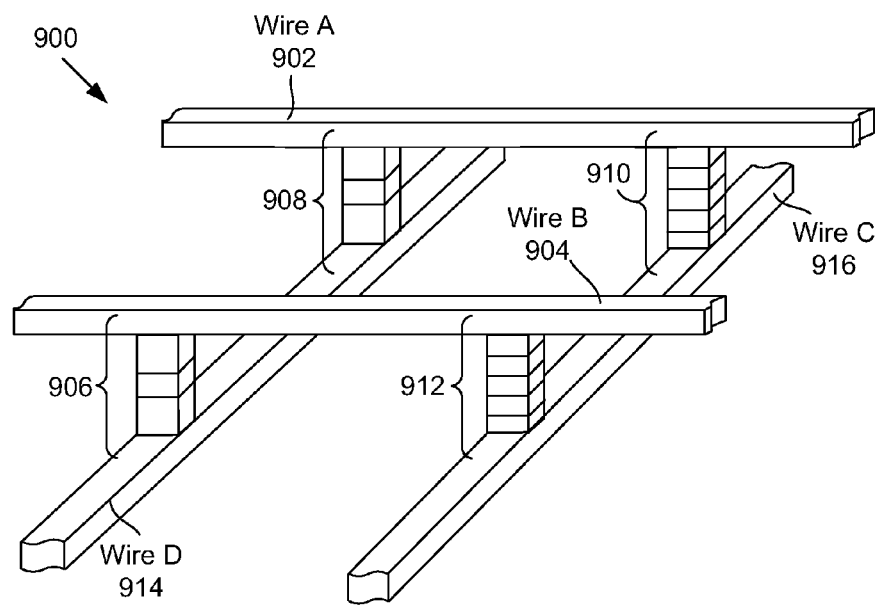
FIG. 9 is diagram of a portion of a crossbar array that includes several NDR comparator circuits, according to one example of principles described herein.

FIG. 9 shows a small portion of a crossbar array (900) that includes a first layer of approximately parallel nanowires (902, 904) and a second layer of approximately parallel nanowires (914, 916). The first layer of nanowires intersect the second layer of nanowires. A number of the NDR devices (906, 908, 910, 912) have been formed between the intersections between wires (902, 904) in the top layer and wires (914, 916) in the bottom layer. The wires may serve as the top and bottom conductive layers in the NDR devices. For example, when forming a NDR device similar to the example shown in FIG. 1C, an upper wire could form the top electrode (105, FIG. 1C) and the bottom wires could form the bottom electrode (115, FIG. 1C).

FIG. 9 shows various types of composite NDR devices formed between intersecting wires. For example, a first composite NDR device (906) may be the device shown in FIG. 1A. A second composite NDR device (908) may be the device shown in FIG. 1C. A third composite NDR device (910) may be the device shown in FIG. 4B and the fourth composite NDR device (912) may be the device shown in FIG. 1B. The different structures could include more or less layers, layers that have different compositions than described above, and layers that are ordered in different ways than shown in the examples given above. For example, the crossbar array could also include memristors, memcapacitors, meminductors, or other memory elements. Further, the memory array could use a wide range of conductors to form the crossbars. The crossbars could have a variety of sizes and cross sectional shapes. In one example, the crossbars have nanoscale cross sections.

A variety of other composite NDR devices could also be integrated into a crossbar array. For example, the NDR device could span multiple crossbar intersections. In one implementation of the composite NDR device shown in FIG. 1C, an upper wire could form the top electrode (105, FIG. 1C) and a lower wire at the same intersection could form the central portion (130, FIG. 1C), with the first NDR layer (135, FIG. 1C) sandwiched between the upper wire and lower wire. The second NDR layer (135, FIG. 1C) could extend from the lower wire to an adjacent intersection. One of the wires at the adjacent intersection can then be used as the lower electrode (115, FIG. 1C). Other configurations and distributions of NDR material could be used to form the composite NDR device. A variety of other devices, such as memory elements and sensors could also be integrated into the crossbar array or into the composite NDR devices. Additionally, the crossbar array may be used to implement the current comparator of FIG. 8A or similar circuits.

The integration of the composite NDR devices into crossbar arrays may have a number of benefits, including high device densities and integral addressing. The composite NDR devices could provide extremely high speed switching within the crossbar array to support other devices within the crossbar array or external to the crossbar array.

Figure 10:
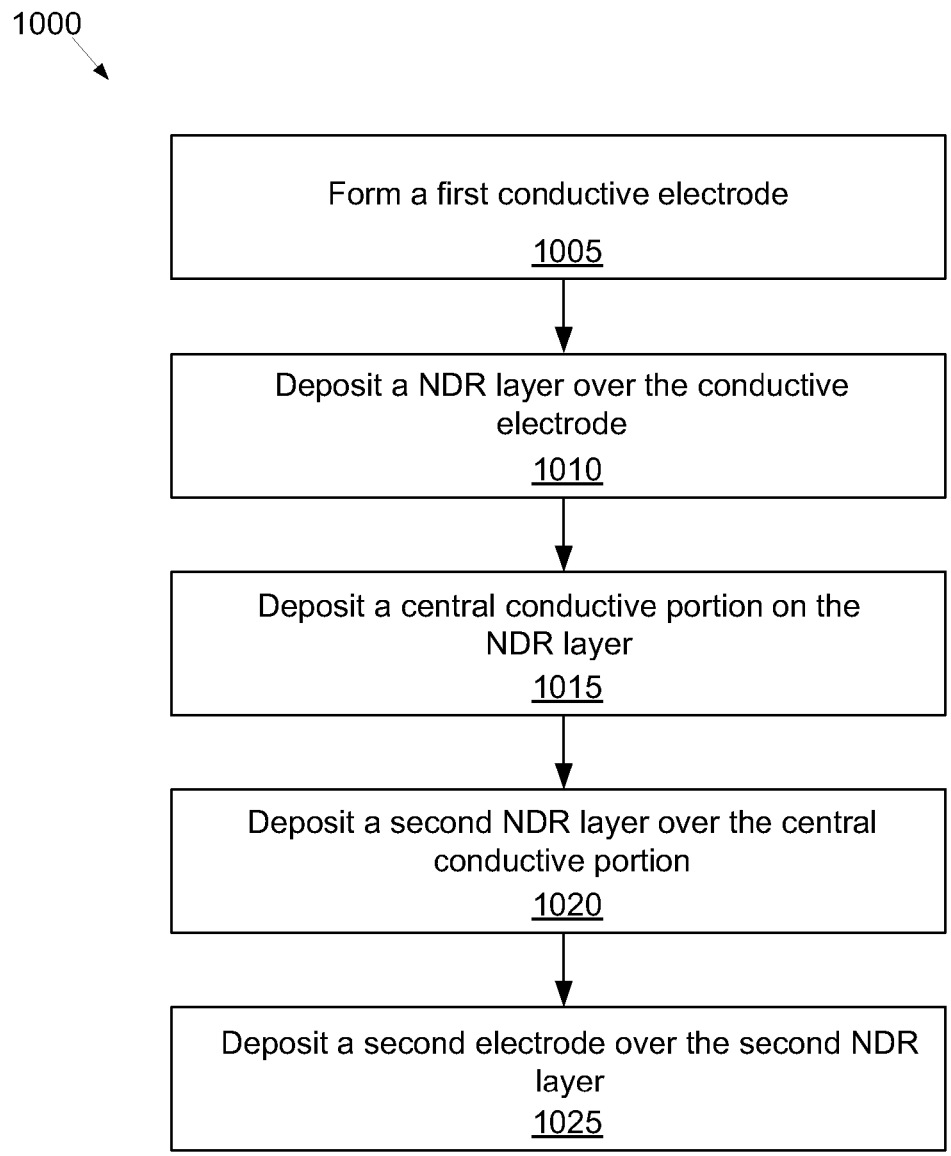
FIG. 10 is a flowchart of an illustrative method for forming comparator circuits that include oxide-based negative differential devices, according to one example of principles described herein.

FIG. 10 is a flowchart of an illustrative method for forming an oxide-based negative differential resistance comparator circuit. The method includes forming a conductive electrode (block 1005) and depositing a NDR device over the conductive electrode (block 1010). As discussed above, the conductive electrode and NDR layer may be formed using a variety of techniques and materials. The NDR layer may be formed using the same technique as the conductive electrode or using a different technique.

A central conductive portion is deposited on the NDR layer (block 1015). The central conductive portion may be used to extract an output voltage in some designs and may be composed of a single layer or multiple conductive layers. A second NDR layer may be deposited over the central conductive portion (block 1020). The second NDR layer may have the same characteristics as the first NDR layer or may have different characteristics. The NDR layers may be voltage controlled or current controlled. A second electrode is then deposited over the second NDR layer (block 1025). Additional layers may be added to the comparator circuit as desired. The resulting combined NDR device can be integrated into a larger comparator circuit.

In conclusion, an oxide-based NDR comparator circuit provides a simple, robust device with a compact step-like transfer function. These comparator functions may be used as Schmitt triggers or as simple comparators in analog circuit applications. Additionally, some circuits may produce one or more hysteresis loops.

The preceding description has been presented only to illustrate and describe examples of the principles described. This description is not intended to be exhaustive or to limit these principles to any precise form disclosed. Many modifications and variations are possible in light of the above teaching.

What is claimed is:

1. An oxide-based negative differential resistance comparator circuit comprising:
    a composite NDR device comprising:
        a first electrode;
        a first thin film negative differential resistance (NDR) layer in contact with the first electrode;
        a central conductive portion;
        a second thin film NDR layer over the central conductive portion; and
        a second electrode disposed on the second thin film NDR layer;
    a resistor in series with the composite NDR device; and
    an electrical energy source to apply a voltage across the first electrode and second electrode, in which the composite NDR device is to produce a threshold based stepping transfer function in the comparator circuit.

2. The circuit of claim 1, in which the composite NDR device comprises the first NDR layer in series with the second NDR layer.

3. The circuit of claim 1, in which NDR layers are current controlled NDR layers.

4. The circuit of claim 3, in which the current controlled NDR layers comprise at least one of: metal oxides and nitrides.

5. The circuit of claim 3, in which the current controlled NDR layers comprise at least one of: vanadium oxide, niobium oxide, binary titanium oxide, nickel monoxide, molybdenum oxides, tungsten oxides, manganese oxides, and niobiates, tungsten oxide, and alloys thereof.

6. The circuit of claim 3, in which an output voltage is to be extracted from the conductive center portion.

7. The circuit of claim 1, in which the central conductive portion comprises a conductive metal oxide.

8. The circuit of claim 1, in which the central conductive portion comprises a conductive metal oxide sandwiched between two metal layers.

9. The circuit of claim 1, in which the NDR layers are voltage controlled NDR layers.

10. The circuit of claim 9, in which the voltage controlled NDR layers comprise at least one of: chrome doped vanadium ($V_2O_3$), zirconium tungsten oxide, and conductive materials with positive thermal coefficient of resistance.

11. The circuit of claim 9, in which the voltage controlled NDR layers are in parallel branches of the comparator circuit, in which the comparator circuit is a current comparator.

12. The circuit of claim 1, further comprising a crossbar array comprising an upper wire and a lower wire, and the composite NDR device is formed at an intersection between the upper wire and the lower wire, in which the upper wire comprises the first electrode and the lower wire comprises one of the central conductive portion or the second electrode.

13. The circuit of claim 1, in which the comparator circuit exhibits two hysteresis loops.

14. An oxide-based negative differential resistance comparator circuit comprising:
a composite NDR device comprising:
a first thin film oxide-based current controlled NDR device;
a second thin film oxide-based current controlled NDR device;
an electrode interposed between the first NDR device and the second NDR device;
a first resistor, in which the first NDR device, the second NDR device, and the first resistor are in series within the composite NDR device; and
a load resistor in parallel with second NDR device, the load resistor being connected to the electrode interposed between the first NDR device and the second NDR device;
a current source to apply a current through the composite NDR device, in which the comparator circuit is configured as a current comparator comprising a first threshold and a second threshold, in which the first threshold is applied to increasing currents and the second threshold applies to decreasing currents, in which the first threshold is greater than the second threshold.

15. A method for forming an oxide-based negative differential resistance comparator circuit comprises:
forming a first conductive electrode;
depositing a first NDR layer on the first electrode;
depositing a central conductive portion on the first NDR layer;
depositing a second NDR layer on the central conductive portion; and
forming a second electrode on the second NDR layer.

* * * * *

UNITED STATES PATENT AND TRADEMARK OFFICE
CERTIFICATE OF CORRECTION

PATENT NO. : 8,525,553 B1
APPLICATION NO. : 13/459877
DATED : September 3, 2013
INVENTOR(S) : Wei Yi et al.

Page 1 of 1

It is certified that error appears in the above-identified patent and that said Letters Patent is hereby corrected as shown below:

In the Claims:

In column 10, lines 42-43, in Claim 5, delete "niobiates," and insert -- niobates, --, therefor.

Signed and Sealed this
Twenty-eighth Day of January, 2014

Michelle K. Lee
*Deputy Director of the United States Patent and Trademark Office*